United States Patent
Louwers

(10) Patent No.: US 11,027,969 B2
(45) Date of Patent: Jun. 8, 2021

(54) MICRO-DEVICE HAVING A METAL-SEMICONDUCTOR COMPOUND LAYER PROTECTED AGAINST HF ETCHING AND METHOD FOR MAKING THE SAME

(71) Applicant: COMMISSARIAT A L'ENERGIE ATOMIQUE ET AUX ENERGIES ALTERNATIVES, Paris (FR)

(72) Inventor: Stephanus Louwers, La Buisse (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/138,061

(22) Filed: Sep. 21, 2018

(65) Prior Publication Data

US 2019/0092632 A1 Mar. 28, 2019

(30) Foreign Application Priority Data

Sep. 25, 2017 (FR) ..................................... 17 58848

(51) Int. Cl.
*B81C 1/00* (2006.01)
*B81B 3/00* (2006.01)

(52) U.S. Cl.
CPC ........ *B81C 1/00595* (2013.01); *B81B 3/0097* (2013.01); *B81C 1/00801* (2013.01); *B81B 2203/0136* (2013.01); *B81B 2207/015* (2013.01); *B81C 1/00476* (2013.01); *B81C 2201/014* (2013.01); *B81C 2201/0109* (2013.01); *B81C 2201/0132* (2013.01);

(Continued)

(58) Field of Classification Search
CPC ............ B81C 1/00595; B81C 1/00801; B81C 1/00468–00484; B81C 1/00563–00587; B81C 2201/014; B81C 2201/0133; B82B 2203/0136

See application file for complete search history.

(56) References Cited

U.S. PATENT DOCUMENTS 6,020,272 A * 2/2000 Fleming .............. B81C 1/00626
                                                         216/2
6,090,638 A * 7/2000 Vigna ................. B81C 1/00246
                                                      257/E21.573

(Continued)

OTHER PUBLICATIONS

French Preliminary Search Report dated Jun. 6, 2018 in French Application 17 58848 filed on Sep. 25, 2017 (with English Translation of Categories of Cited Documents).

*Primary Examiner* — Younes Boulghassoul
(74) *Attorney, Agent, or Firm* — Oblon, McClelland, Maier & Neustadt, L.L.P.

(57) ABSTRACT

A micro-device including at least one first element comprising at least:
  a portion of material corresponding to a compound of at least one semi-conductor and at least one metal,
  first and second protective layers each covering one of two opposite faces of said portion of material, such that the first and second protective layers are in direct contact with said portion of material, that the first protective layer comprises at least one first material able to withstand an HF etching, that the second protective layer comprises at least one second material able to withstand the HF etching, and that at least one of the first and second materials able to withstand the HF etching includes the semi-conductor.

15 Claims, 5 Drawing Sheets

(52) U.S. Cl.
CPC ............. *B81C 2201/0133* (2013.01); *B81C 2201/0181* (2013.01)

(56) References Cited

U.S. PATENT DOCUMENTS

| | | | |
|---|---|---|---|
| 7,816,166 B1* | 10/2010 | Quevy | B81C 1/0015 |
| | | | 438/52 |
| 8,440,523 B1* | 5/2013 | Guillorn | B81C 1/00396 |
| | | | 438/243 |
| 2005/0052092 A1* | 3/2005 | Laermer | B81C 1/00801 |
| | | | 310/311 |
| 2006/0205106 A1* | 9/2006 | Fukuda | B81C 1/00246 |
| | | | 438/52 |
| 2010/0065934 A1* | 3/2010 | Eriksen | G01L 9/0054 |
| | | | 257/419 |
| 2011/0053378 A1* | 3/2011 | Baiocchi | H01L 21/31111 |
| | | | 438/706 |
| 2012/0313235 A1* | 12/2012 | Chu | B81B 7/007 |
| | | | 257/692 |
| 2016/0023893 A1* | 1/2016 | Besling | H01L 29/84 |
| | | | 257/415 |

* cited by examiner

MICRO-DEVICE HAVING A METAL-SEMICONDUCTOR COMPOUND LAYER PROTECTED AGAINST HF ETCHING AND METHOD FOR MAKING THE SAME

TECHNICAL FIELD AND PRIOR ART

The invention relates to the field of micro-devices, that is micro-electromechanical systems (MEMS) and/or nano-electromechanical systems (NEMS) and/or micro-opto-electromechanical systems (MOEMS) and/or nano-opto-electromechanical systems (NOEMS), including for example movable elements. In the following, the term "micro-device" is used to designate in particular a MEMS and/or NEMS and/or MOEMS and/or NOEMS type device. The invention relates, for example, to a sensor and/or actuator type micro-device.

Upon making a micro-device, it often occurs that one or more steps of releasing elements from the micro-device (for example interdigitated fingers or other types of movable or static elements) are implemented by vapour and/or liquid HF (hydrofluoric acid) etching, in order to etch materials such as $SiO_2$ which are present above and/or below semi-conductor layers and/or metal layers of these elements. But, such an etching is problematic when a silicide, for example $WSi_2$, is in contact with HF because of the degradation generated by HF on silicide. For example, if a $WSi_2$ layer with a thickness equal to about 100 nm formed on a $SiO_2$ layer in turn arranged on a silicon substrate is in contact with HF as vapour, a $WSi_2$ delamination thereby occurs because of the attack of the grain boundaries by HF.

Silicide can be intentionally used in the micro-device, for example to form one or more elements of this micro-device, because of its low contact electric resistance, its ability to connect the N-type semi-conductor with the P-type semi-conductor without forming a diode, its compatibility with self-aligned methods or even its high-temperature resistance. Silicide can also be unintentionally present in the micro-device, for example because of a reaction of a metal element on which silicon which is deposited at high temperature is located, which generates silicide formation at the interface between metal and silicon.

This degradation problem in contact with HF is also found when silicide is comprised of a metal other than tungsten, for example titanium, but also for other materials corresponding to compounds of at least one semi-conductor and at least one metal, and which are not compatible with HF, that is which degrades in the presence of HF.

DISCLOSURE OF THE INVENTION

Thus, there is a need for a micro-device comprising an element formed by a material corresponding to a compound of semi-conductor and metal and which is not compatible with HF, and which is protected towards an HF etching.

For this, there is provided a micro-device including at least one first element comprising at least:
a portion of material corresponding to a compound of at least one semi-conductor and at least one metal,
first and second protective layers each covering one of two opposite faces of said portion of material, such that the first protective layer comprises at least one first material able to withstand an HF etching, that the second protective layer comprises at least one second material able to withstand the HF etching, and that at least one of the first and second materials able to withstand the HF etching includes the semi-conductor.

Further, the first and second protective layers are in direct contact with the portion of material to be protected.

Thus, it is provided to make one or more elements of the micro-device as a stack comprising a portion of material corresponding to a compound of at least one semi-conductor and at least one metal, for example a silicide, which portion is interposed between protective layers formed of materials withstanding an HF etching and thus protecting the portion of material during an HF etching. The portion of material thereby can provide to this (these) element(s) the desired property(ies), for example the desired electric resistance, and the protective layers make the presence of this (these) element(s) compatible with the implementation of an HF etching.

Further, one of the first and second materials able to withstand the HF etching includes the semi-conductor of the compound forming the portion of material to be protected, which means that the compound can be made by reacting at least one metal and this semi-conductor material of at least one of the first and second protective layers.

This is applicable to any type of micro-device including such a material corresponding to a compound of semi-conductor and metal, for example a silicide, and that has to undergo steps of HF etching. Thus, this can avoid a delamination or etching (attack) of this semi-conductor-metal compound.

A compound of at least one semi-conductor and at least one metal corresponds to a material the atomic composition of which includes one or more atoms of the semi-conductor and one or more atoms of this metal.

A material able to withstand an HF etching may correspond to a material which is not degraded when the same is in contact with HF, or more generally a material on which an HF attack will have no impact on the operation of the micro-device.

Preferably, the materials able to withstand an HF etching may have an etching rate, towards HF, lower than or equal to about 1 nm/min.

The two opposite faces of the portion of material which are covered with the first and second protective layers may correspond to both main faces of the portion of material. The terms "main faces" of the portion of material designates the faces having the higher areas of the portion of material. These two opposite faces of the portion of material which are covered with the first and second protective layers may correspond to the upper and lower faces of the portion of material. Both opposite faces of the portion of material may be substantially parallel to a substrate on which the micro-device is made.

There is also described a structure for forming a micro-device, including at least one first element comprising at least:
a portion of material corresponding to a compound of at least one semi-conductor and at least one metal,
first and second protective layers each covering one of two opposite faces of said portion of material, such that the first protective layer comprises at least one first material able to withstand an HF etching, that the second protective layer comprises at least one second material able to withstand the HF etching, and that at least one of the first and second materials able to withstand the HF etching includes the semi-conductor.

This structure may include at least one material able to be etched by an HF etching, arranged around at least one part of the first element, and/or on the side of the first protective layer and/or of the second protective layer. More generally, this material able to be etched by HF etching may be arranged in the vicinity or proximity of the first element such that upon etched by an HF, the first protective layer and/or the second protective layer protect the portion of material of the first element towards HF.

Advantageously, the portion of material may include $WSi_2$ and the first and second protective layers may include silicon.

The first element may be part of a fixed element of the micro-device. The first element may correspond for example to an interconnection element of fingers of a fixed or static comb, for being interdigitated with another comb of the micro-device the fingers of which are movable.

The micro-device may further include a substrate to which the first element may be connected by at least one dielectric portion. This dielectric portion may form at least one fixed connection element from the first element to the substrate.

The micro-device may further include one or more microelectronic components made on the substrate. The micro-device may for example be co-integrated on the substrate with an electronic circuit for example of the CMOS type.

The micro-device may further include at least one second element connected to the first element by at least one semi-conducting portion arranged between the second element and one of the first and second protective layers. Such a second element may correspond for example to one or more fingers of a static comb, that is a non-movable comb, for being interdigitated with a movable comb of the micro-device. The fingers of the static comb may be electrically interconnected through the portion of material of the first element.

There is also provided a method for making a micro-device, during which at least one first element of the micro-device is made by implementing at least the steps of:
- making a stack of a first layer and of two second layers such that the first layer is arranged between the two second layers, that the first layer includes at least one metal, that one of the two second layers comprises at least one first material able to withstand an HF etching, that the other of the two second layers comprises at least one second material able to withstand the HF etching, and that at least one of the first and second materials able to withstand the HF etching includes a semi-conductor;
- heat treating, reacting a part of the semi-conductor with the metal, forming a portion of material corresponding to a compound of the semi-conductor and the metal, and such that at least one remaining part of each of the two second layers form first and second protective layers each covering one of two opposite faces of said portion of material and such that the first and second protective layers are in direct contact with said portion of material;

and further comprising implementing a step of HF etching during which said portion of material is protected from HF by the first and second protective layers.

The method may further include, after the step of making the stack, the steps of:
- depositing a dielectric layer covering at least the remaining portions of the stack (that may correspond to the parts of the stack which are kept after the stack etching, or correspond to the portion of material and to the first and second protective layers if the heating treatment is implemented before this deposition);
- etching a part of the dielectric layer, forming at least one access to the first element;
- depositing a semi-conductor material in the access formed through the dielectric layer and on the dielectric layer, forming a second element connected to the first element by at least one portion of semi-conductor arranged between the second element and the first element;
- and the step of HF etching may be implemented such that it removes the dielectric layer.

The method may further include, before implementing the HF etching, a step of making at least one spacer covering at least one part of the side faces, which are substantially perpendicular to both opposite faces, of the portion of material of the first element and comprising at least one third material able to withstand the HF etching.

BRIEF DESCRIPTION OF THE DRAWINGS

The present invention will be better understood upon reading the description of exemplary embodiments given by way of purely indicating and in no way limiting purposes making reference to the appended drawings in which.

Identical, similar or equivalent parts of the different figures described hereinafter bear the same reference numerals so as to facilitate switching from one figure to the other.

The different parts shown in the figures are not necessarily drawn to a uniform scale, to make the figures more readable.

The different possibilities (alternatives and embodiments) should be understood as being non-exclusive to each other and can be combined to each other.

DETAILED DISCLOSURE OF PARTICULAR EMBODIMENTS

Figure 1:
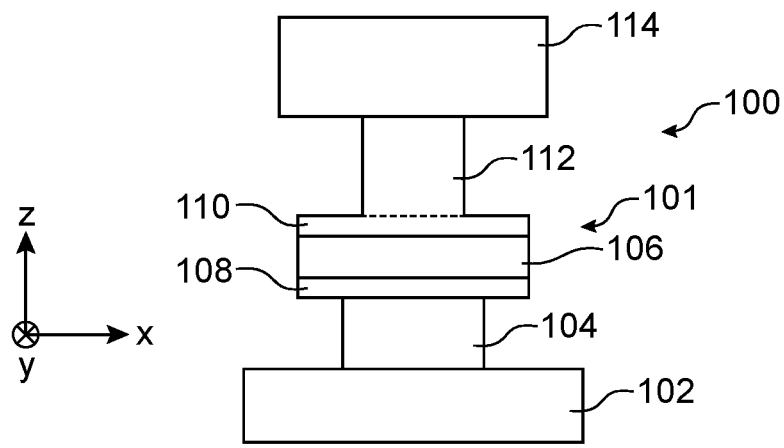
FIGS. 1, 13 and 14 show a micro-device including at least one element formed by a compound of at least one semiconductor and at least one metal and protected towards an HF etching, according to a first embodiment.
Figure 13:
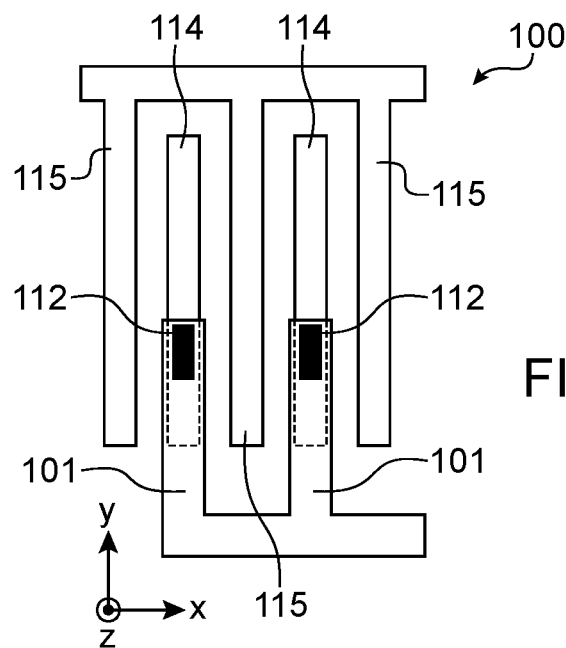
Figure 14:
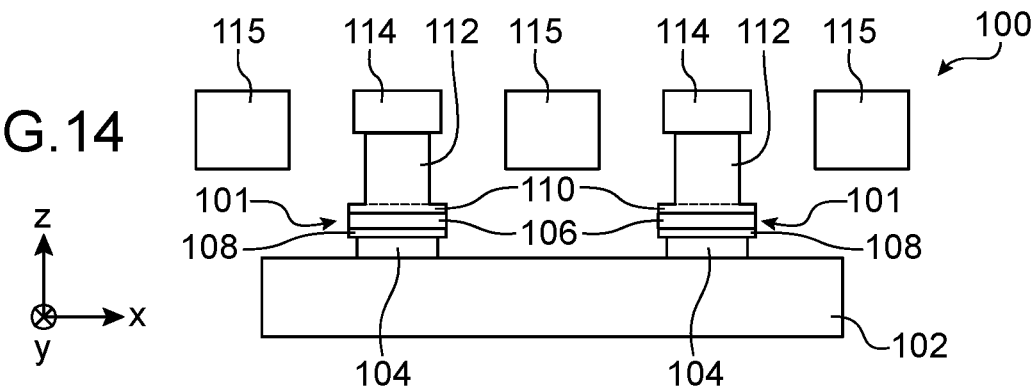

FIG. 1 is first referred to, which shows a part of a micro-device 100 according to a first embodiment. FIGS. 13 and 14 show a more global view of the micro-device 100.

This micro-device 100 is for example a sensor and/or an actuator, and includes one or more elements 101 made from a material corresponding to a compound of at least one semi-conductor and at least one metal, advantageously a silicide (that is a material comprising silicon and at least one metal) and for example $WSi_2$. The element(s) 101 of the micro-device 100 comprising this material may correspond to one or more fixed elements of the micro-device 100, for example a finger interconnecting element of a fixed comb of the micro-device 100. FIG. 1 shows a cross-section view of a part of the micro-device 100 on which one of these elements 101 is visible.

The micro-device 100 is made on a substrate 102 forming a support for the micro-device 100. This substrate 102 here includes a semi-conductor, for example silicon and/or germanium. Its thickness (dimension along the axis Z shown in FIG. 1) is for example equal to several hundreds of microns, and is for example between about 400 μm and 750 μm.

One or more dielectric portions 104 (a single one is visible in FIG. 1) are present in the substrate 102, forming one or more portions for holding the element(s) 101 of the micro-device 100 on the substrate 102. The dielectric portion 104 includes for example a semi-conductor oxide, advantageously $SiO_2$. The thickness of the dielectric portion 104 (dimension along the axis Z shown in FIG. 1) is for example between about 100 nm and 3 μm.

The element 101 visible in FIG. 1 includes a portion 106 of the material comprising at least one semi-conductor and at least one metal (for example $WSi_2$), arranged between two protective layers 108, 110. The protective layers 108, 110 each include a material able to withstand an HF etching, for example at least one semi-conductor such as silicon. The lower protective layer 108 is arranged between the portions 104 and 106, and the upper protective layer 110 is arranged between the portion 106 and another portion 112 connecting the element 101 to another element 114 of the micro-device 100. The portion 112 and the element 114 include for example a semi-conductor such as silicon. The portion 106 is in direct contact with the protective layers 108, 110.

The protective layers 108, 110 play the role of protecting the portion 106 towards an HF attack upon making the micro-device 100. The lower protective layer 108 covers the entire rear face of the portion 106 (that located on the side of the portion 104 and of the substrate 102) and is in contact with the portion 104, and the upper protective layer 110 covers the entire upper face of the portion 106 (that located on the side of the portion 112 and of the element 114) and is in contact with the portion 112. The lower and upper faces of the portion 106 form the main faces of the portion 106. Each of the protective layers has a thickness (dimension along the axis Z visible in FIG. 1) for example between about 10 nm and 300 nm.

The thickness of the portion 106 (dimension along the axis Z visible in FIG. 1) is for example between about 150 nm and 600 nm.

In FIGS. 13 and 14, in addition to the elements 101 and 114, movable elements 115 of the comb which is interdigitated with that comprising the elements 114 are shown.

Alternatively to this first embodiment, it is possible that one of the protective layers 108, 110 includes not a semi-conductor but at least one dielectric material withstanding an HF etching. Such a dielectric material corresponds for example to SiN, $HfO_2$, $Al_2O_3$ or even AlN.

According to another alternative, it is possible that the protective layers 108, 110 each include a semi-conductor material different from the other. In this case, the compound forming the portion 106 may incorporate chemical elements, or atoms, of one or each of these two semi-conductors.

An exemplary method for making the micro-device 100 according to the first embodiment is described below in connection with FIGS. 2 to 8.

The micro-device 100 is made from the substrate 102 on which a dielectric layer 116 from which the portions 104 are intended to be made (FIG. 2) is formed. When the dielectric layer 116 includes a semi-conductor oxide, it may be made by oxidising the semi-conductor of the substrate 102. The thickness of the dielectric layer 116 (dimension along the axis Z visible in FIG. 2) corresponds to that of the portions 104 intended to be made, and is for example between about 100 nm and 3 μm.

Figure 3:
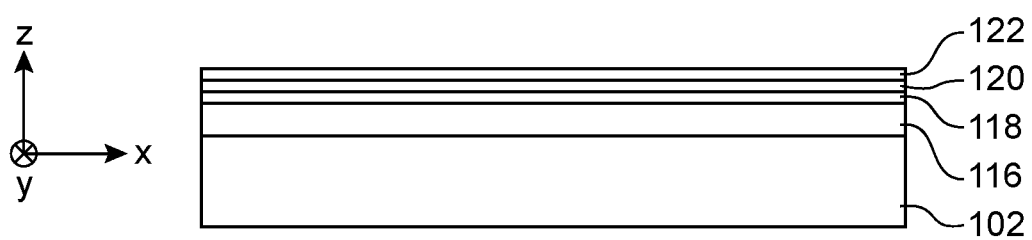

In FIG. 3, a layer 118 of the material intended to form the lower protective layer 108, herein silicon, is deposited onto the dielectric layer 116. The layer 118 may be deposited by PVD (Physical Vapour Deposition). The thickness of the layer 118 (dimension along the axis Z visible in FIG. 3) is for example between about 75 nm and 550 nm.

Alternatively, the dielectric layer 116 and at least one part of the layer 118 may be initially present on the substrate 102, for example using a SOI substrate.

A metal layer 120, from which the portions 106 are intended to be made, is then deposited on the layer 118. In the exemplary embodiment described herein, the material of the metal layer 120 corresponds to tungsten. The thickness of the metal layer 120 (dimension along the axis Z visible in FIG. 3) is for example between about 50 nm and 200 nm. The metal layer 120 may be made by implementing a PVD deposition.

Finally, another layer 122 of the material for forming the upper protective layer 110, herein silicon, is deposited onto the metal layer 120. The layer 122 may be deposited by PVD (Physical Vapour Deposition). The thickness of the layer 122 (dimension along the axis Z visible in FIG. 3) is for example between about 75 nm and 550 nm.

Advantageously, the layers 118 and 122 may include for example amorphous silicon deposited by PVD.

When the layers 118, 120, 122 are all deposited by PVD, these three deposition steps may be implemented during a single passage of the substrate 102 and of the dielectric layer 116 in a PVD deposition equipment, without venting the assembly between these deposition steps.

Figure 4:
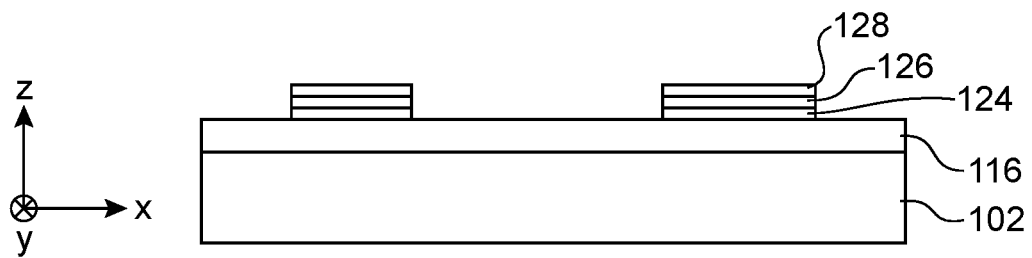

A mask, the pattern of which corresponds to that of the portions 106 and of the protective layers 108, 110, is then formed on the layer 122. A photolithography and etching, for example by plasma, of the layers 118, 120, 122 are then implemented in order to form the portions 124, 126, 128 of the layers 118, 120, 122 respectively from which the portions 106 and the protective layers 108, 110 will be made (FIG. 4). The pattern, in the main plane of the substrate 102 (plane (X, Y) in FIG. 4), of the stacks formed by the portions 124, 126, 128 corresponds to that of the stacks 106, 108, 110 intended to be made. The mask is then removed, for example by the plasma pathway and then by the chemical pathway.

Figure 5:
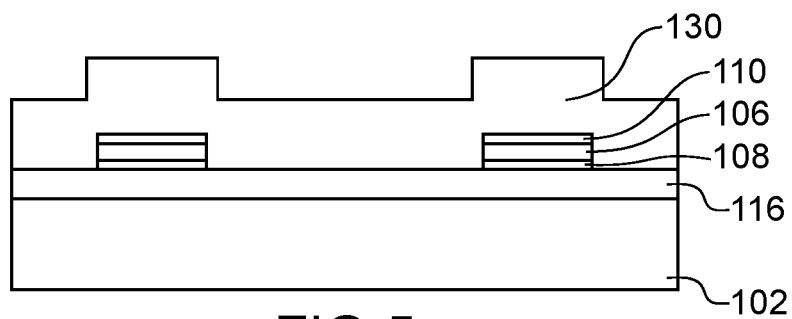

As shown in FIG. 5, a dielectric layer 130, comprising for example $SiO_2$, is deposited by covering the dielectric layer 116 as well as the portions 128. This dielectric layer 130 corresponds to that intended to be subsequently etched by HF.

An annealing is then implemented such that the material of the portions 126 and that of the portions 124, 128 (or of a single one of the portions 124, 128 when the other of these two portions includes not a semi-conductor but a dielectric material), which are in contact with each other, react and form the final material of the portions 106 corresponding to a compound of the metal of the layer 120 and of the semi-conductor material(s) of one or the layer(s) 118, 122. This annealing is for example implemented at a temperature between about 500° C. and 1 000° C. When this annealing is intended to form portions 106 of $WSi_2$ from tungsten portions arranged between silicon portions, this annealing is for example implemented at a temperature equal to about 900° C.

In the exemplary embodiment described herein, the metal (tungsten) of the metal portions 126 reacts with the semi-conductor (silicon) of the portions 124, 128 to form the compound ($WSi_2$) of the portions 106. Advantageously, the material of at least one of the portions 124, 128, and which corresponds to the material of at least one of the protective layers 108, 110, corresponds to silicon such that the material of the portions 106 which is obtained at the end of the annealing corresponds to a silicide. When one of both protective layers 108, 110 includes a dielectric material, this dielectric material does not react with the metal of the metal portions 126 to form the final material of the portions 106.

During this annealing, the semi-conductor material(s) of one or the portion(s) 124, 128 react(s) with the metal of the metal portions 126. Thus, the thickness of the protective layers 108, 110 obtained after implementing this annealing is lower than that of the portions 124, 128 before the annealing, and the thickness of the portions 106 obtained after this annealing is higher than that of the metal portions 126 before the annealing. Thus, it is suitable to judiciously choose the initial thicknesses of the layers 118, 120, 122 such that at the end of the annealing, a part of the portions 124, 128 is still present against the main faces of the portions 106 such to protect these portions from these faces. In the example described herein where the portions 124, 128 include silicon and the metal of the portions 126 is tungsten, the initial thickness of each of the layers 118, 120 may be between about 75 nm and 550 nm in order that at the end of the annealing, the final thickness of each of the protective layers 108, 110 is between about 10 nm and 300 nm.

According to one alternative, it is possible that the annealing is implemented before depositing the dielectric layer 130, or even before the step of etching the layers 118, 120, 122.

In this case, or when this annealing and the corresponding reaction between the materials of the portions 126 on one side, and the portions 124 and/or 128 on the other side, cause too high a roughness, a planarization step (for example by CMP, or chemical mechanical polishing) may be implemented in order to reduce this roughness, and therefore facilitate the implementation of the following operations.

Figure 6:
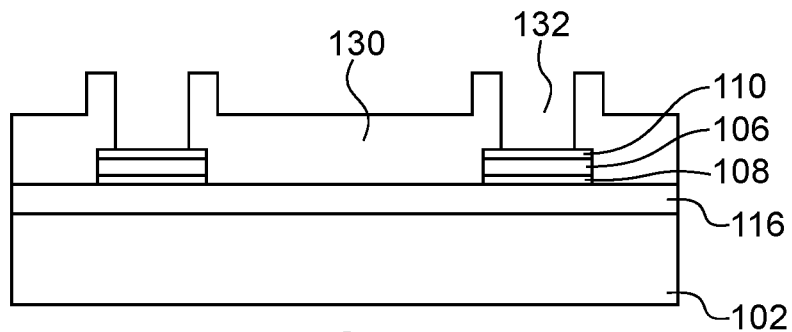

After this annealing, and possibly after the planarization step, a lithography and etching are implemented through the dielectric layer 130 in order to form accesses 132 to the stacks of the portions 106 and the protective layers 108, 110, with stopping on the material of the protective layers 110 (FIG. 6).

Figure 7:
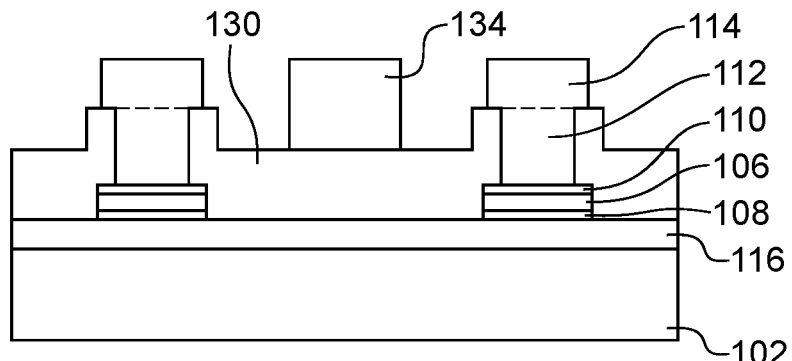

As shown in FIG. 7, a washing is then implemented, and then a deposition, for example by epitaxy, is made in order to obtain a layer of material for forming in particular the portions 112 and 114. A chemical mechanical planarization and then a lithography and etching complete the formation of the portions 112, 114 in contact with the stacks of the portions 106 and the protective layers 108, 110. Other parts 134 of the material deposited are used to form other elements of the micro-device 100.

Figure 8:
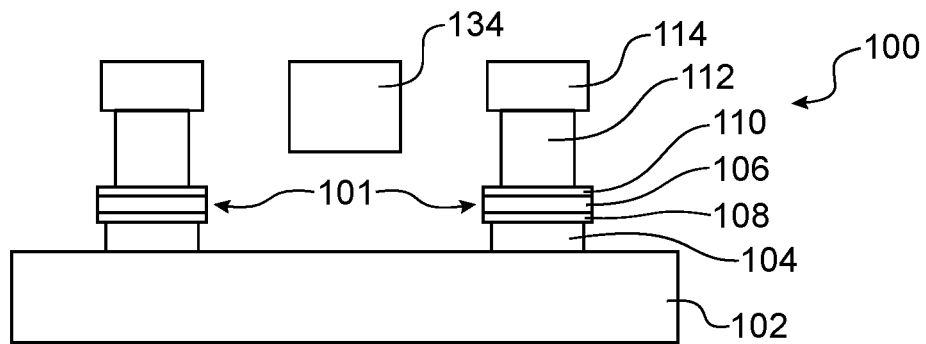

The method is completed by performing an HF etching of the dielectric layer 130 (FIG. 8). During this etching, the protective layers 108 and 110 protect the portions 106 on the side of their front and rear faces. This etching also forms the portions 104 from the dielectric layer 116.

Figure 9:
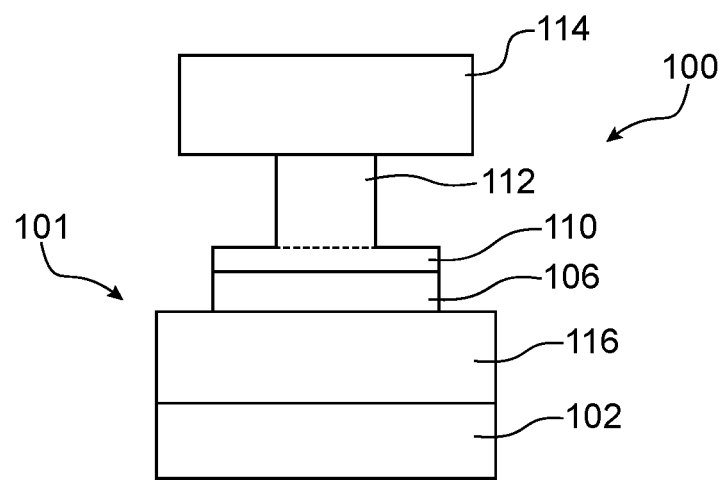
FIG. 9 shows a micro-device including at least one element formed by a compound of at least one semiconductor and at least one metal and protected towards an HF etching, according to a second embodiment.

FIG. 9 shows the micro-device 100 according to a second embodiment.

In comparison with the first embodiment described previously, the lower protective layer 108 and the dielectric portion 104 correspond to a single dielectric element formed by the dielectric layer 116. This dielectric element covers the entire rear face of the portion 106 and the dielectric material of this element corresponds to a material withstanding an HF etching, as for example SiN, $HfO_2$, $Al_2O_3$ or even AlN. The portion 106 is in direct contact with the protective layer 110 and the dielectric layer 116.

For making such a micro-device 100, the layer 116 is made with a material and a thickness suitable for forming this dielectric element. The depositions of the layers 120 and 122 previously described in connection with FIG. 3 are then implemented, the layer 120 being directly formed on the dielectric layer 116. The steps previously described in connection with FIGS. 4 to 8 are then implemented as in the first embodiment.

In the embodiments described previously, the side faces of the portions 106 are not protected during the HF etching. However, the elements 101 have generally significant lateral dimensions, for example several microns or even several tens of microns, which limits the impact of the HF etching at the side faces of the portions 106.

Figure 10:
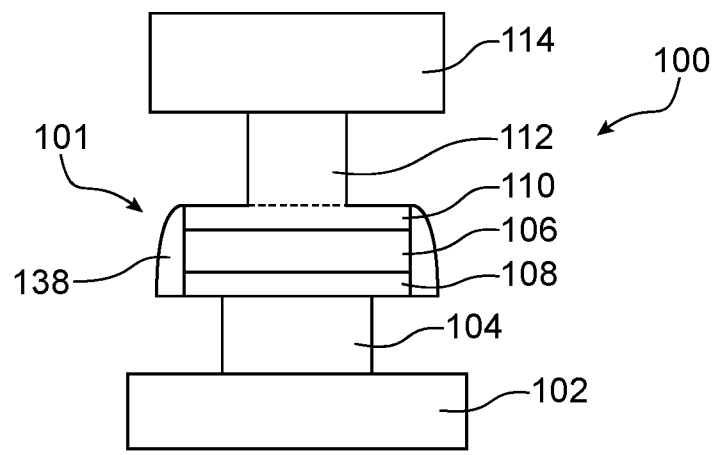
FIG. 10 shows a micro-device including at least one element formed by a compound of at least one semiconductor and at least one metal and protected towards an HF etching, according to a third embodiment.

It is however possible to protect the side faces of the portions 106. FIG. 10 shows the micro-device 100 according to a third embodiment in which these side faces are protected during the HF etching.

The micro-device 100 according to this third embodiment includes all the elements of the micro-device 100 according to the first embodiment, and in particular the portions 106 arranged between the protective layers 108, 110 and in direct contact with these protective layers 108, 110. However, the micro-device 100 according to this third embodiment further includes, against the side faces of the portions 106, spacers 138 protecting these side faces against HF etching implemented during the method. These spacers 138 have for example a width in the order of 100 nm. The spacers 138 include a material withstanding an HF etching, and for example one or more of the following materials: Si, AlN, $Al_2O_3$, $HfO_2$, SiN. In addition, in the example shown in FIG. 10, these spacers 138 also cover the side faces of the protective layers 108, 110. These spacers 138 are also herein in direct contact with the portions 106.

By way of example, when the material of the portions 106 corresponds to $TiSi_2$ or $CoSi_2$, the micro-device 100 is preferably made such that the side faces of the portions 106 are protected by the spacers 138. When the material of the portions 106 corresponds for example to $Ru_2Si_3$, $TaSi_2$, PtSi or even $NiSi_2$, the micro-device 100 may be made with or without the spacers 138. The choice of whether the spacers 138 are present or not may be made depending on the sensitivity of the material of the portions 106 to HF.

Figure 11:
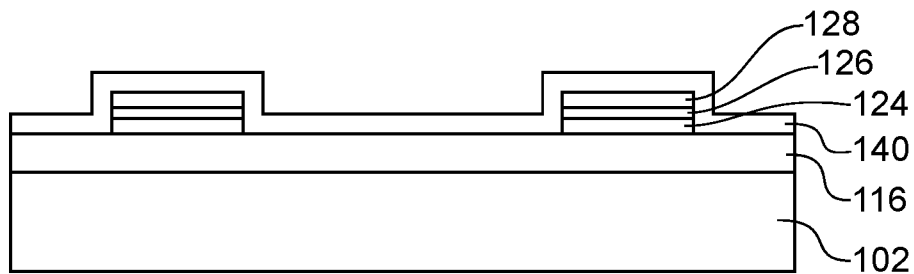
FIGS. 11 and 12 show a part of the steps of a method for making the micro-device according to the third embodiment.

A method for making the micro-device 100 according to the third embodiment is described below in connection with FIGS. 11 and 12.

Figure 2:
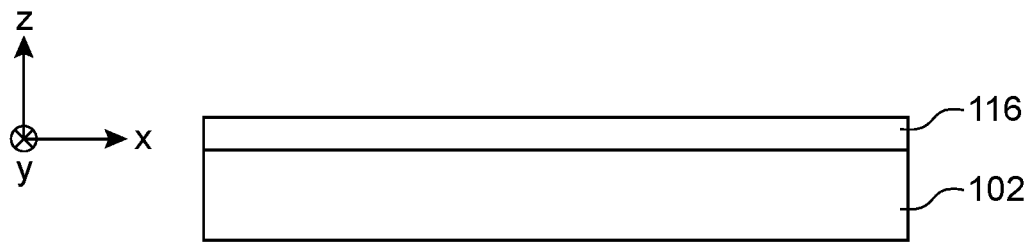
FIGS. 2 to 8 show the steps of a method for making the micro-device according to the first embodiment.

The steps previously described in connection with FIGS. 2 to 4 are first implemented. Then, prior to depositing the dielectric layer 130, a layer 140 for forming the spacers 138 is deposited by covering the dielectric layer 116 as well as the portions 128 (FIG. 11). This layer 140 corresponds either to a single layer of a single material, or to a stack of several materials.

Figure 12:
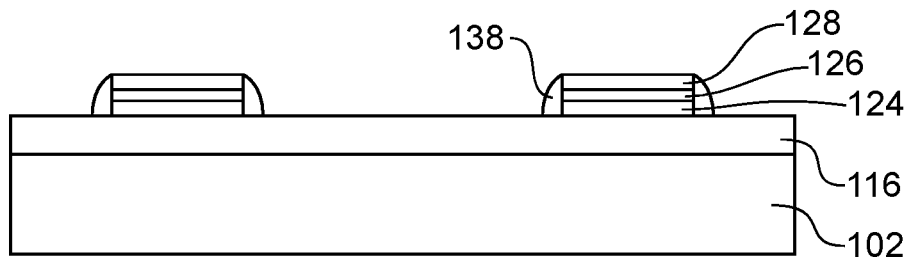

The layer 140 is then etched such that the remaining portions of this layer 140 correspond to the spacers 138 (FIG. 12).

Making the micro-device 100 is completed by implementing the steps previously described in connection with FIGS. 5 to 8.

Figure 15:
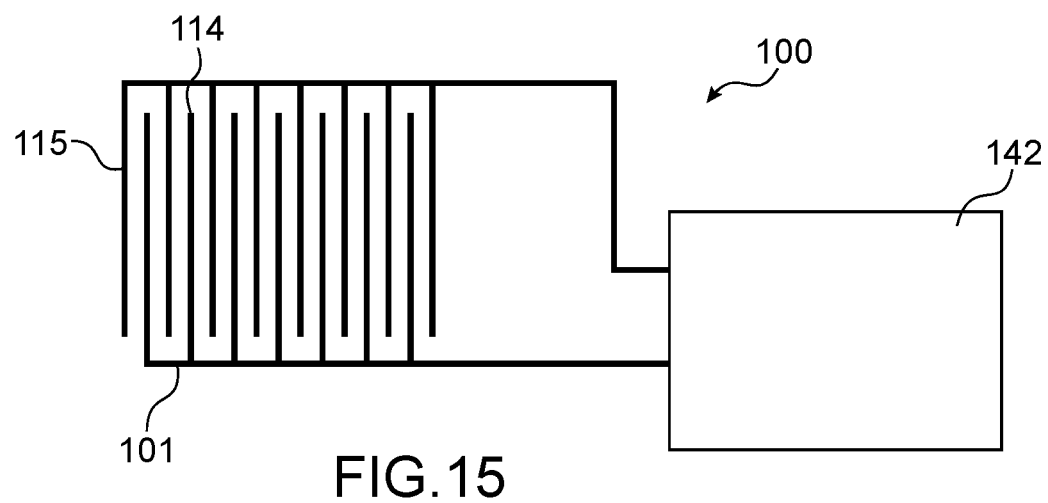
FIGS. 15 and 16 show a micro-device integrated with a CMOS circuit.
Figure 16:
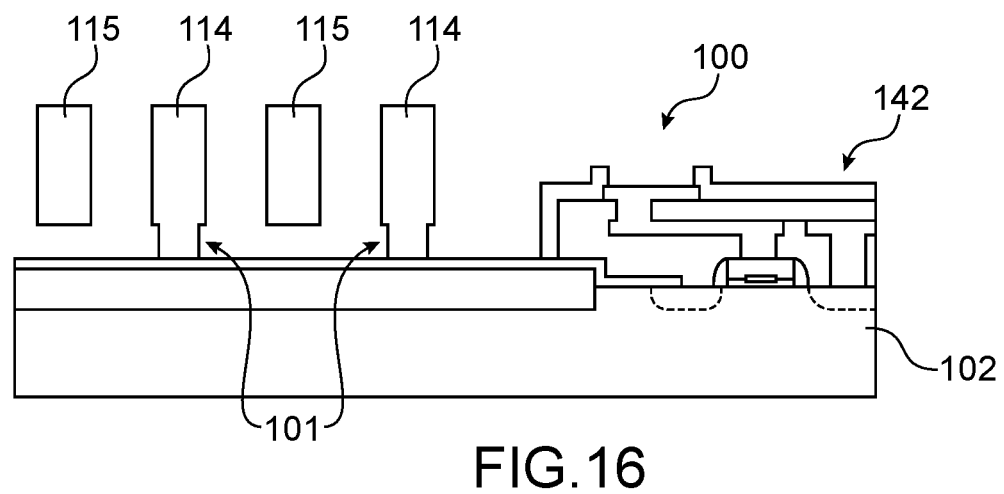

Whatever the embodiment of the micro-device 100, this micro-device 100 may include or be integrated with one or more micro-electronic devices, as for example MOS type components. FIGS. 15 and 16 show the micro-device 100 when integrated on the substrate 102 with a CMOS circuit 142 coupled with interdigitated combs formed by the fingers 114, 115.

The invention claimed is:

1. A micro-device including at least one first element comprising at least:
   a layer of material consisting of a compound of at least one semi-conductor and at least one metal;
   a substrate to which the at least one first element is connected; and
   first and second protective layers each directly contacting two opposite faces of said layer of material, such that the first and second protective layers are not in direct contact with each other at all points above the substrate, that the first protective layer comprises at least one first material able to withstand an HF etching, that the second protective layer comprises at least one second material able to withstand the HF etching, and that at least one of the first and second materials able to withstand the HF etching includes the semi-conductor.

2. The micro-device according to claim 1, wherein at least one of the following properties is fulfilled by the micro-device:
   the semi-conductor includes Si;
   the at least one metal includes at least one of the following chemical elements: W, Ti, Co, Ru, Ta, Pt, Ni;
   the at least one first material and the at least one second material able to withstand the HF etching include at least one of the following chemical compounds: Si, SiN, AlN, $Al_2O_3$, $HfO_2$.

3. The micro-device according to claim 1, wherein the at least one first element is part of a fixed element of the micro-device.

4. The micro-device according to claim 1, wherein the at least one first element is connected to the substrate by at least one dielectric portion.

5. The micro-device according to claim 4, further including one or more micro-electronic components made on the substrate.

6. The micro-device according to claim 1, further including at least one second element connected to the at least one first element by at least one semi-conducting portion arranged between the at least one second element and one of the first and second protective layers.

7. The micro-device according to claim 1, wherein the at least one first element further includes at least one spacer covering at least one part of side faces, which are substantially perpendicular to both opposite faces, of the layer of material of the at least one first element and comprising at least one third material able to withstand the HF etching.

8. The micro-device according to claim 1, wherein each of the first and second materials able to withstand the HF etching includes the semi-conductor or a dielectric material.

9. A method for making a micro-device, during which at least one first element of the micro-device is made, the method comprising:
   making, on a substrate, a stack of a first layer and of two second layers such that the first layer is arranged between the two second layers, that the first layer includes at least one metal, that one of the two second layers comprises at least one first material able to withstand an HF etching, that the other of the two second layers comprises at least one second material able to withstand the HF etching, and that at least one of the first and second materials able to withstand HF etching includes a semi-conductor;
   heat treating, such that a part of the semi-conductor reacts with the metal to form a layer of material consisting of a compound of the semi-conductor and the metal, and such that at least one remaining part of each of the two second layers form first and second protective layers each directly contacting two opposite faces of said layer of material and such that the first and second protective layers are not in direct contact with each other at all points above the substrate;
   and further comprising implementing a step of HF etching during which said layer of material is protected from HF by the first and second protective layers.

10. The method according to claim 9, further including, after the step of making the stack, a step of etching the stack of the first layer and the second layers with a pattern geometrically defining the at least one first element.

11. The method according to claim 9, further including, after the step of making the stack:
    depositing a dielectric layer covering at least remaining portions of the stack;
    etching a part of the dielectric layer, forming at least one access to the at least one first element;
    depositing a semi-conductor material in the access formed through the dielectric layer and on the dielectric layer, forming a second element connected to the at least one first element by at least one portion of semi-conductor arranged between the second element and the at least one first element;
    and wherein the step of HF etching is implemented such that it removes the dielectric layer.

12. The method according to claim 9, further including, before implementing the HF etching, a step of making at least one spacer covering at least one part of side faces, which are substantially perpendicular to both opposite faces, of the layer of material of the at least one first element and comprising at least one third material able to withstand the HF etching.

13. The method according to claim 9, wherein the stack is made on another dielectric layer arranged on the substrate.

14. The method according to claim 13, wherein the step of HF etching also etches said another dielectric layer such that at least one remaining portion of said another dielectric layer connects the at least one first element to the substrate.

15. The method according to claim 13, further including making one or more micro-electronic components on the substrate.

* * * * *